United States Patent
Ahn et al.

(10) Patent No.: US 6,653,198 B2
(45) Date of Patent: Nov. 25, 2003

(54) METHOD FOR FABRICATING CAPACITOR IN SEMICONDUCTOR DEVICE AND CAPACITOR FABRICATED THEREBY

(75) Inventors: Byoung Kwon Ahn, Seoul (KR); Joon Ho Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,017

(22) Filed: Dec. 27, 2002

(65) Prior Publication Data

US 2003/0124812 A1 Jul. 3, 2003

(30) Foreign Application Priority Data

Dec. 28, 2001 (KR) .............................. 10-2001-0087229

(51) Int. Cl.$^7$ .............................................. H01L 21/20
(52) U.S. Cl. ..................... 438/396; 438/253; 438/240; 438/399; 257/296; 257/306; 257/310
(58) Field of Search .................. 438/253, 254, 438/255, 256, 396, 398, 399, 386, 243, 240; 257/296, 298, 300, 306, 308, 310

(56) References Cited

U.S. PATENT DOCUMENTS

| | | | |
|---|---|---|---|
| 5,489,548 A | * 2/1996 | Nishioka et al. | 438/396 |
| 5,605,858 A | * 2/1997 | Nishioka et al. | 438/396 |
| 5,612,574 A | * 3/1997 | Summerfelt et al. | 257/295 |
| 5,925,972 A | * 7/1999 | Shrader et al. | 310/338 |
| 6,320,213 B1 | * 11/2001 | Kirlin et al. | 257/295 |
| 6,479,345 B2 | * 11/2002 | Ahn et al. | 438/253 |
| 6,525,922 B2 | * 2/2003 | Winer et al. | 438/248 |

* cited by examiner

Primary Examiner—Kevin M. Picardat
(74) Attorney, Agent, or Firm—Ladas & Parry

(57) ABSTRACT

A capacitor in a semiconductor device and fabricating method therefor are disclosed, in which the capacitor in a semiconductor device comprises: a semiconductor substrate, a first Ru film formed on the semiconductor substrate, a $Y_2O_3$ film formed on the first Ru film, a TiON film formed on the $Y_2O_3$ film, and a second Ru film formed on the TiON film; and the method for fabricating a capacitor in a semiconductor device comprising the steps of: providing a semiconductor substrate, forming a first Ru film on the semiconductor substrate, forming a $Y_2O_3$ film on the first Ru film, forming a TiON film on the $Y_2O_3$ film, and forming a second Ru film on the TiON film.

12 Claims, 4 Drawing Sheets

METHOD FOR FABRICATING CAPACITOR IN SEMICONDUCTOR DEVICE AND CAPACITOR FABRICATED THEREBY

BACKGROUND OF THE INVENTION

1. Field of the Invention

The present invention relates to a capacitor in a semiconductor device and a method for fabricating the same, more particularly to a capacitor in a semiconductor device and a method for fabricating the same, in which an Ru (Ruthenium) metal is employed as a lower electrode and an upper electrode in a metal-nonconductor-metal structure.

2. Description of the Prior Art

As generally known in the art, a capacitor which is capable of storing much electrical charge in a small area along with a high integration of a semiconductor device is required. Therefore, a capacitor with a metal-nonconductor-silicon structure employing TiON ($\epsilon r=-50$) which has a high dielectric ratio, is used for a DRAM which has a capacity above 256 Mb, instead of a conventional NO film.

However, the capacitor with the metal-nonconductor-silicon structure comes to a limitation in fabricating a capacitor having a high capacity, because $SiO_2$ is formed at an interface between a dielectric TiON and a polysilicon layer which is a storage node.

Accordingly, a capacitor with a metal-nonconductor-metal structure is employed in a DRAM of a giga-bit level. In this case, as polysilicon is employed as a plug, a barrier/plug with a $TiN_2/TiSi_2/Si$ structure is employed in spite of some problems in the fabricating process.

However, as the oxidation resistant property of a TiN/$TiSi_2$ layer is not adequate, a barrier layer is oxidized due to oxygen which remains in a lower electrode and flows in from outside in following processes, which improves heat treatment of the lower electrode and crystallization of the dielectric and leakage currents characteristics.

SUMMARY OF THE INVENTION

Accordingly, the present invention has been made to solve the above-mentioned problems occurring in the prior art, and an object of the present invention is to provide a capacitor in a semiconductor device and fabricating method for the same, which is capable of improving electrical characteristics of a capacitor by employing a dual dielectric composed of $Y_2O_3$/TiON.

In order to accomplish this object, there is provided a capacitor in a semiconductor device comprising: a semiconductor substrate, a first Ru film formed on the semiconductor substrate, a $Y_2O_3$ film formed on the first Ru film, a TiON film formed on the $Y_2O_3$ film; and a second Ru film formed on the TiON film.

Also, according to another aspect of the present invention, there is provided a method for fabricating a capacitor in a semiconductor device comprising the steps of: providing a semiconductor substrate, forming a first Ru film on the semiconductor substrate, forming a $Y_2O_3$ film on the first Ru film, forming a TiON film on the $Y_2O_3$ film, and forming a second Ru film on the TiON film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
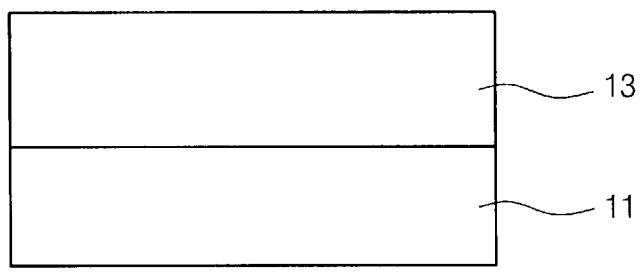
FIG. 1 to FIG. 11 are sectional views illustrating each step of a method for fabricating a capacitor in a semiconductor device, and the capacitor fabricated thereby in accordance with the present invention.

According to a method for fabricating a capacitor in a semiconductor device in accordance with the present invention, as shown in FIG. 1, a first interlayer insulating film 13 is first deposited on a semiconductor substrate 11 to a desired thickness.

Then, although not shown in the drawings, photo-sensitive materials are distributed on the first interlayer insulating film 13, and an exposure process or a developing process and selective patterning of the photo-sensitive materials are carried out, thereby forming a photo-sensitive film pattern (not shown).

Figure 2:
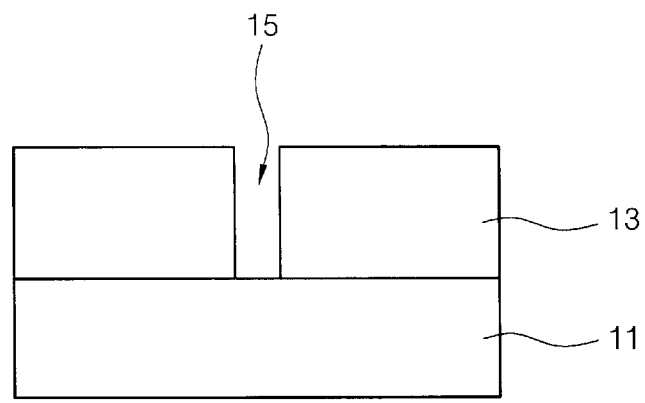

Next, as shown in FIG. 2, a first contact hole 15 exposing a portion of the semiconductor substrate 11 is formed through selective patterning of the first interlayer insulating film 13, using the photo-sensitive film pattern (not shown) as a mask.

Figure 3:
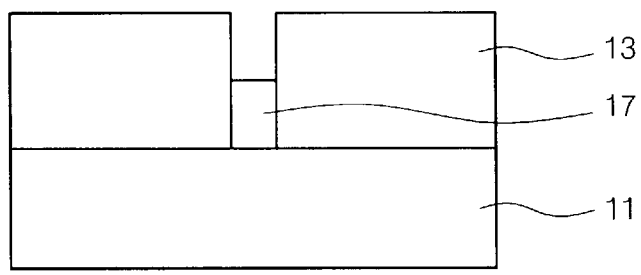

Subsequently, as shown in FIG. 3, after the removal of the photo-sensitive film pattern, a polysilicon which is used for a plug and is employed to fill the first contact hole 15, is deposited on the first interlayer insulating film 13 and the first contact hole 15, and a polysilicon layer pattern is formed in the first contact hole 15 by etching back the polysilicon. In this instance, the polysilicon layer pattern has a thickness to cover a part of the first contact hole 15. Also, an epitaxial silicon layer can be used instead of the polysilicon.

Figure 4:
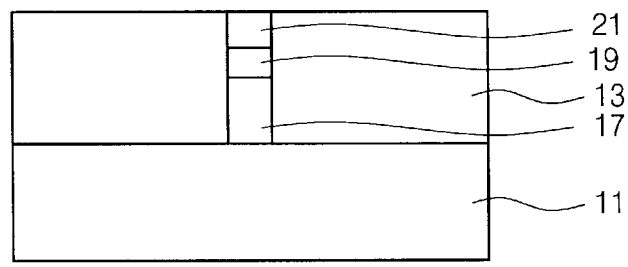

Referring now to FIG. 4, a Ti layer 19 and a TiN layer 21 are successively formed on the polysilicon layer pattern 17 in the first contact hole 15. In this instance, the Ti layer 19 and the TiN layer 21 are employed as barrier films.

Figure 5:
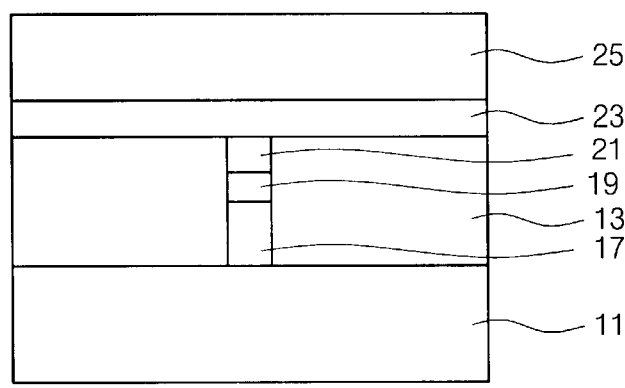

Referring to FIG. 5, a barrier nitride film 23 and a cap oxide film 25 are successively formed on the first interlayer insulating film 13 and the TiN layer 21 so as to form a cylindrical structure.

Figure 6:
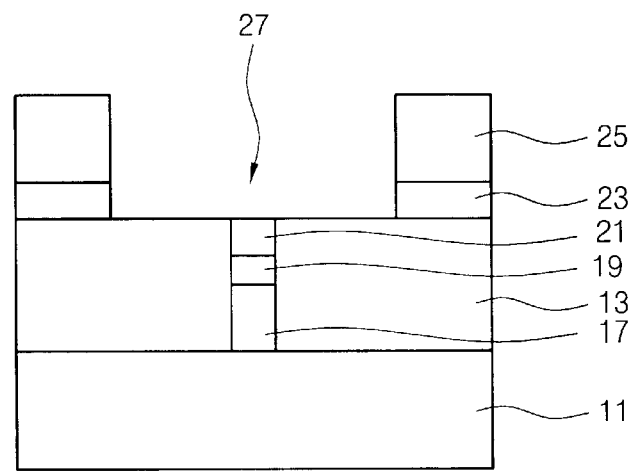

Then, as shown in FIG. 6, a second contact hole 27 is formed by selective removal of the cap oxide film 25 and barrier nitride film 23 so as to expose an entire surface of the TiN layer 21 and a part of the first interlayer insulating film 13 by employing a mask (not shown) for defining a storage node region.

Figure 7:
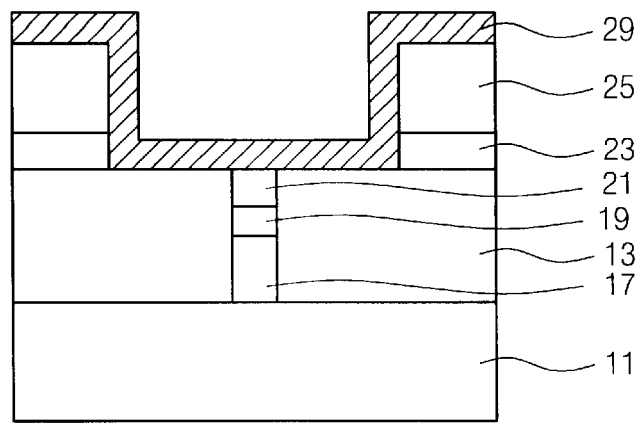

Next, as shown in FIG. 7, an Ru (Ruthenium) film 29 is deposited to a thickness of about 200 to 500 Å for use as a lower electrode on the first contact hole 27 and the cap oxide film 25.

In this case, a deposition process for the Ru film 29 will be simply explained below.

At first, a tris (2,4-octanedionate) ruthenium [Ru(OD)$_3$] which is a source of Ru film, is transformed to a vapor state, and a wafer temperature is maintained at 250 to 280° C. Also, a reaction furnace is maintained at 0.3 to 0.7 torr in pressure, oxygen is used as a reaction gas and the amount of the oxygen is maintained at 250 to 400 sccm.

Figure 8:
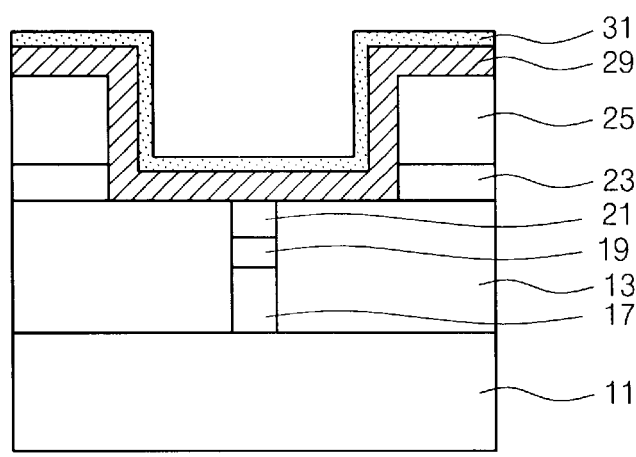

Subsequently, as shown in FIG. 8, a $Y_2O_3$ film 31 is deposited on the Ru film 29. In this instance, as a deposition condition of the $Y_2O_3$ film 31, the wafer temperature is maintained at 250 to 500° C., and the $Y_2O_3$ film 31 has a thickness of 10 to 100 Å, and a CVD (Chemical Vapor Deposition), or an ALD (Atomic Deposition) method is employed as a deposition method.

Figure 9:
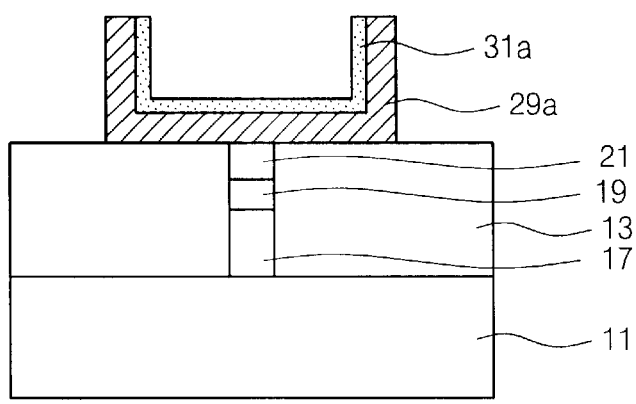

As shown in FIG. 9, the $Y_2O_3$ film 31a and the Ru film 29a are made to be a cylindrical shape after CMP (Chemical-Mechanical Polishing) processing of the $Y_2O_3$ film 31 and the Ru film 29, and removing of the remaining cap oxide film 25.

Figure 10:
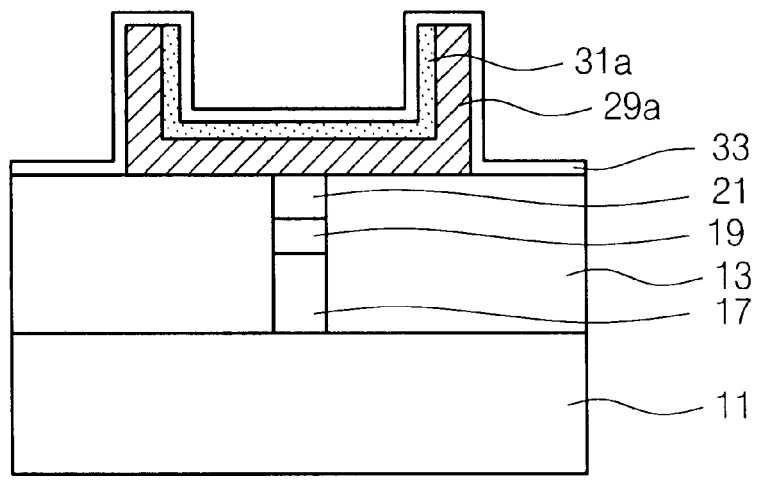

Then, as shown in FIG. 10, a TiON film 33 is deposited on an entire surface of the exposed products that include the remaining $Y_2O_3$ film 31a and Ru film 29a. In this instance, in the process of the deposition of the TiON film 33, $TiCl_4$ source is first transformed to be in a vapor state at a vaporizer maintained at a temperature of 170 to 190° C., and the deposition process is carried out at an atmosphere of $NH_3$ gas in amounts of 10 to 1000 sccm, while maintaining the pressure and temperature of the reaction furnace at 0.1 to 1.2 torr and 300 to 400° C. respectively.

Next, although not shown in the drawings, a vacuum annealing treatment or an RTP (Rapid Thermal Process) is carried out in a furnace under an atmosphere of $N_2$ gas at 500 to 650 temperature for 5 to 60 minutes so as to remove carbon and maintain an increased amount of nitrogen ($N_2$) in the TiON film 33.

Figure 11:
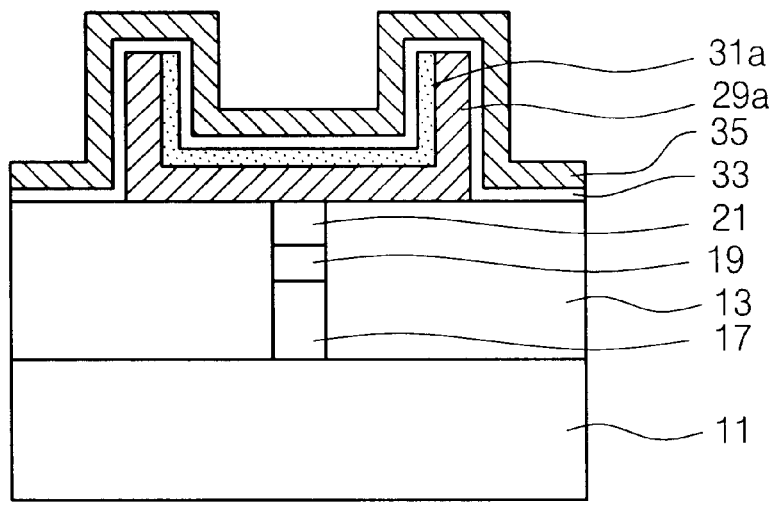

Subsequently, as shown in FIG. 11, a second Ru film 35 is deposited on the TiON film 33 as an upper electrode to a thickness of 500 to 1500 Å.

Conditions for depositing the second Ru film 35 are simply explained below.

At first, a tris (2,4-octanedionate) ruthenium which is a source for Ru film is transformed to a vapor state, and a wafer temperature is maintained at 250 to 280° C. Also, a reaction furnace is maintained at 0.3 to 1.0 torr in pressure, and oxygen ($O_2$) is used as a reaction gas and the amount of the oxygen is maintained at 250 to 400 sccm.

In accordance with a method for fabricating a capacitor in a semiconductor device of the present invention, the following advantages are achieved.

According to the present invention, an upper electrode made of Ru film is deposited at once without a UV $O_3$ plasma treatment for compensating an oxygen after the deposition of the TiON film, because the oxygen ($O_2$) intentionally left over is used in a process of forming an Ru film, and oxygen is supplied to the TiON film after the deposition of the upper electrode through a following annealing treatment. In this instance, a free energy for making a Ta oxide is about –1,600 kcal/mol, which is more than ten times the free energy of the Ru of –130 kcal/mol, so that the oxygen in the Ru can not oxidize Ru, and can contribute to the reduction of leakage current.

Further, as heat treatment process following the formation of the upper electrode is carried out to diffuse the oxygen into TiON, the upper electrode is not deteriorated and damaged.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor in a semiconductor device, the method comprising the steps of:

providing a semiconductor substrate;

forming a first Ru film on the semiconductor substrate;

forming a $Y_2O_3$ film on the first Ru film;

forming a TiON film on the $Y_2O_3$ film; and forming a second Ru film on the TiON film.

2. The method for fabricating a capacitor according to claim 1, further comprising a step of forming a conductive plug between the semiconductor substrate and the first Ru film.

3. The method for fabricating a capacitor according to claim 2, wherein the conductive plug is composed of polysilicon, Ti and TiN, or is formed of a polysilicon or epitaxial silicon layer.

4. The method for fabricating a capacitor according to claim 2, wherein the Ti layer has a thickness of 50 to 500 Å, and the TiN layer has a thickness of 500 to 900 Å.

5. The method for fabricating a capacitor according to claim 1, wherein the step of forming the Ru film is carried out by maintaining a wafer temperature of 250 to 280° C. after transforming a tris (2,4-octanedionato) ruthenium into a vapor state, and maintaining a pressure of a reaction furnace at 0.3 to 0.7 torr and using oxygen as a reaction gas in an amount of 250 to 400 sccm.

6. The method for fabricating a capacitor according to claim 1, wherein the $Y_2O_3$ film is deposited to a thickness of 10 to 100 Å by a CVD or an ALD method at a temperature of 250 to 500° C.

7. The method for fabricating a capacitor according to claim 1, wherein the step of forming a TiON film comprises a step of transforming a $TiCl_4$ into a vapor state in a vaporizer maintained at a temperature of 170 to 190° C., and carrying out formation of the TiON film under an atmosphere of $NH_3$ gas in amounts of 10 to 1000 sccm and a pressure and temperature of a reaction furnace at 0.1 to 1.2 torr and 300 to 400° C.

8. The method for fabricating a capacitor according to claim 1, further comprising a step of carrying out a vaccum annealing treatment or an RTP in a furnace under an atmosphere of $N_2$ gas at 500 to 650° C. temperature for 5 to 60 minutes so as to remove carbons in the TiON film and maintain an increased nitrogen contents after the formation of the TiON film.

9. The method for fabricating a capacitor according to claim 1, wherein the step of forming a second Ru film is carried out by maintaining a wafer temperature of 250 to 280° C. after transforming tris (2,4-octanedionate) ruthenium into a vapor state, and maintaining a pressure of a reaction furnace at 0.5 to 1.0 torr and using oxygen as a reaction gas in an amount of 250 to 400 sccm.

10. A capacitor in a semiconductor device, the capacitor comprising:

a semiconductor substrate;

a first Ru film formed on the semiconductor substrate;

a $Y_2O_3$ film formed on the first Ru film;

a TiON film formed on the $Y_2O_3$ film; and a second Ru film formed on the TiON film.

11. The capacitor in a semiconductor device according to claim 10, further comprising a conductive plug formed between the semiconductor substrate and the first Ru film, the conductive plug being composed of polysilicon, Ti and TiN or composed of a polysilicon or epitaxial silicon layer.

12. The capacitor in a semiconductor device according to claim 11, wherein the Ti layer has a thickness of 50 to 500 Å, and the TiN layer has a thickness of 500 to 900 Å.

* * * * *